United States Patent
Craiovan et al.

(10) Patent No.: US 10,061,306 B2
(45) Date of Patent: Aug. 28, 2018

(54) ALLOCATION OF PRINTED CIRCUIT BOARDS ON FITTING LINES

(71) Applicant: SIEMENS AKTIENGESELLSCHAFT, München (DE)

(72) Inventors: Daniel Craiovan, Nürnberg (DE); Norbert Herold, Litzendorf (DE); Thorsten Kemper, Schnaittach (DE); Alexander Pfaffinger, München (DE); Christian Royer, Ottobrunn (DE)

(73) Assignee: Siemens Aktiengesellschaft, München (DE)

( * ) Notice: Subject to any disclaimer, the term of this patent is extended or adjusted under 35 U.S.C. 154(b) by 582 days.

(21) Appl. No.: 14/412,790

(22) PCT Filed: Apr. 24, 2013

(86) PCT No.: PCT/EP2013/058527
§ 371 (c)(1),
(2) Date: Jan. 5, 2015

(87) PCT Pub. No.: WO2014/005744
PCT Pub. Date: Jan. 9, 2014

(65) Prior Publication Data
US 2015/0160648 A1    Jun. 11, 2015

(30) Foreign Application Priority Data

Jul. 6, 2012  (DE) .................. 10 2012 211 813

(51) Int. Cl.
*G05B 19/00* (2006.01)
*G05B 19/418* (2006.01)
*H05K 13/08* (2006.01)

(52) U.S. Cl.
CPC ........... *G05B 19/418* (2013.01); *H05K 13/08* (2013.01); *G05B 2219/45031* (2013.01)

(58) Field of Classification Search
CPC ........ G05B 2219/45031; G05B 19/418; G05B 2219/45032; H05K 13/08; H05K 13/0404;
(Continued)

(56) References Cited

U.S. PATENT DOCUMENTS 5,170,554 A    12/1992 Davis et al.
5,258,915 A    11/1993 Billington et al.
(Continued)

FOREIGN PATENT DOCUMENTS

CN          1606903 A      4/2005
DE    10 2009 013 353 B3  10/2012
(Continued)

OTHER PUBLICATIONS

NPL_Integer_Linear_Programming: https://en.wikipedia.org/wiki/Integer_programming; pulled on Oct. 23, 2017.*
(Continued)

*Primary Examiner* — Christopher E Everett
(74) *Attorney, Agent, or Firm* — Lempia Summerfield Katz LLC

(57) ABSTRACT

A method for allocating printed circuit boards to the fitting lines of a fitting system configured for fitting printed circuit boards with electronic components includes: determining requirements for fitting each of a plurality of printed circuit boards with respective components; and allocating the printed circuit boards to fitting lines under predetermined conditions by integral linear programming. The allocation is carried out such that differences between the component variances of the fitting lines are minimized. The component variance of a fitting line represent the number of different
(Continued)

components configured to be fitted to all printed circuit boards allocated to the fitting line.

20 Claims, 3 Drawing Sheets

(58) Field of Classification Search
CPC ..... H05K 13/0061; H05K 2201/10674; H05K 2201/10212; Y10T 29/53183; Y10T 29/53174; Y10T 29/4913; Y10T 29/53178; Y10T 29/53191; Y10T 29/49002; H01L 2924/1461; H01L 2924/16225; H01L 25/0652; H01L 23/50; H01L 23/5382; H01L 23/5389
USPC ..... 700/29, 97, 99, 103, 104, 111, 121, 213, 700/215, 218, 219, 221
See application file for complete search history.

(56) References Cited

U.S. PATENT DOCUMENTS

| | | | |
|---|---|---|---|
| 5,371,940 A * | 12/1994 | Suzuki | B23P 21/004 29/703 |
| 8,793,008 B2 | 7/2014 | Bauer et al. | |
| 2004/0143352 A1 * | 7/2004 | Gyorfi | H05K 13/08 700/99 |
| 2004/0143963 A1 | 7/2004 | Mehdianpour et al. | |
| 2004/0235550 A1 * | 11/2004 | McNally | G07F 17/329 463/16 |
| 2007/0204086 A1 * | 8/2007 | Jaroszewski | H05K 13/08 710/262 |
| 2008/0059931 A1 * | 3/2008 | Peters | G06F 17/5072 716/122 |
| 2012/0004762 A1 | 1/2012 | Bauer et al. | |

FOREIGN PATENT DOCUMENTS

| | | |
|---|---|---|
| EP | 0478360 A1 | 4/1992 |
| EP | 0478361 | 4/1992 |
| EP | 0478361 A1 | 4/1992 |
| JP | H04246897 A | 9/1992 |
| JP | H04257968 A | 9/1992 |

OTHER PUBLICATIONS

Gunther et al., Workload Planning in Small LOt Printed Circuit Board Assembly, Jun. 1, 1997, pp. 147-157, vol. 19, No. 2, OR Spektrum.

International Search Report and Written Opinion cited in PCT/EP2013/058527, dated Nov. 11, 2014.

International Search Report and Written Opinion cited in PCT/EP2013/058527, dated Nov. 7, 2013.

Luzzatto et al., Cell Formation in PCB Assembly Based on Production Quantitative Data, Sep. 1, 1993, pp. 312-329, vol. 69, No. 3, European Journal of Operational Research.

Ting, Component Grouping for Printed Circuit Board Assembly, 1999, Department of Manufacturing Engineering, Hong Kong Polytechnic University.

Japanese Office action for related Japanese Application No. 2015-518909,dated Jan. 25, 2016, with English Translation.

Japanese Office action for Related Japanese Application No. 2015-518909 dated Feb. 27, 2017.

Chinese office Action for related Chinese Application No. 201380036049.6, dated Apr. 25, 2016, with English Translation.

Hans-Otto Gunther, "Workload Planning in small lot printed circuit board assembly," Operations-Research-Spektrum, vol. 19, Issue 2, pp. 147-157, Jun. 1997.

* cited by examiner

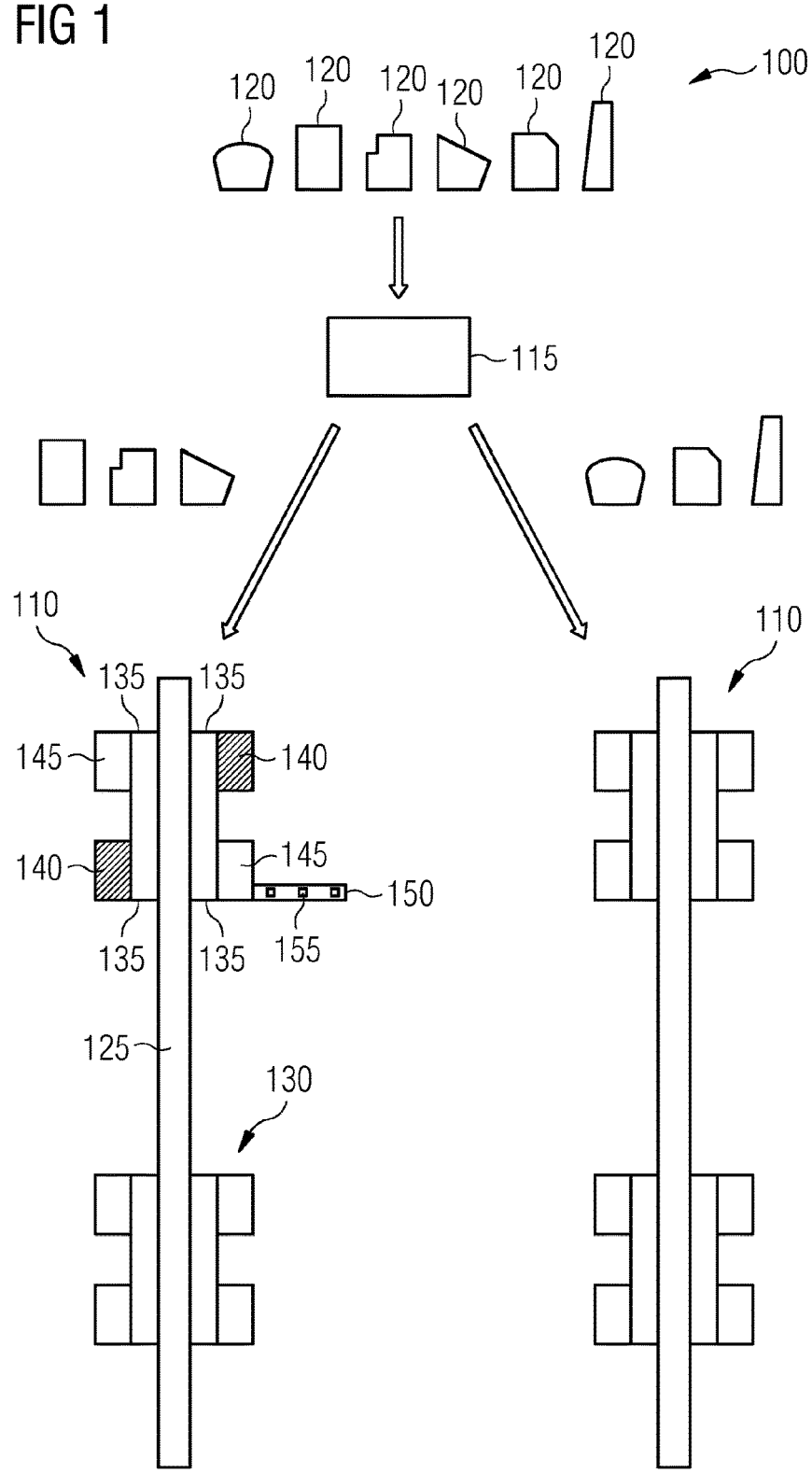

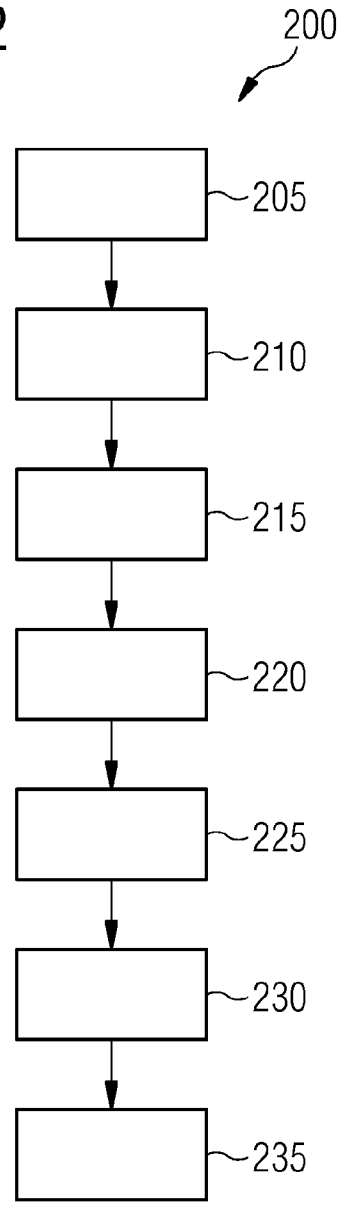

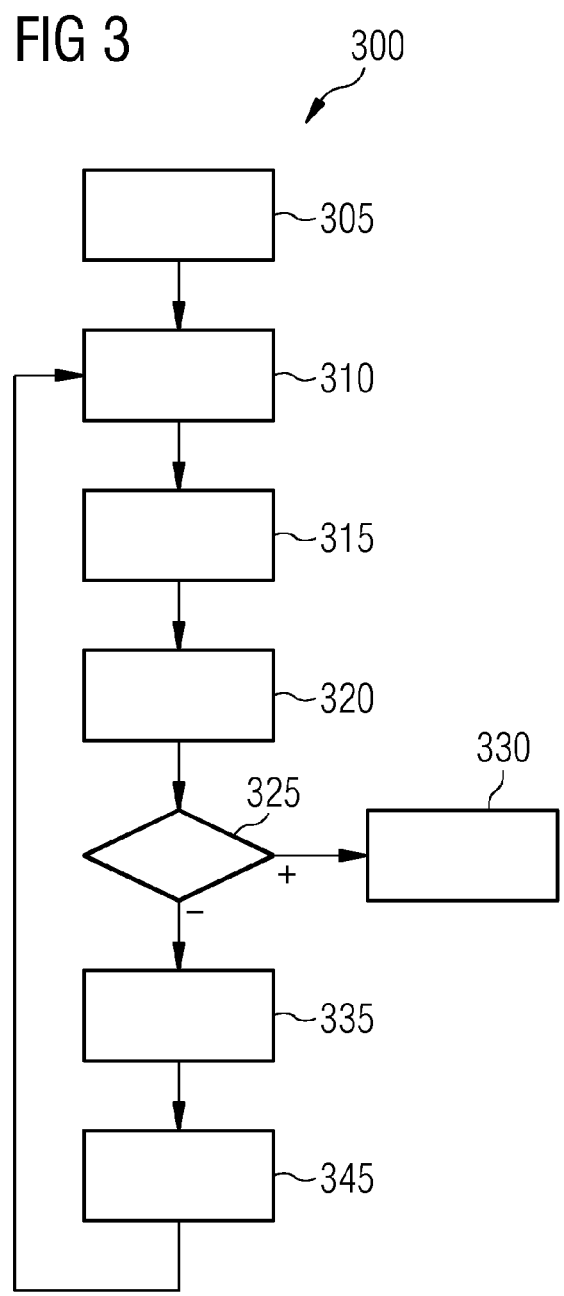

ALLOCATION OF PRINTED CIRCUIT BOARDS ON FITTING LINES

RELATED APPLICATIONS

This application is the National Stage of International Application No. PCT/EP2013/058527, filed Apr. 24, 2013, which claims the benefit of German Patent Application No. DE 102012211813.6, filed Jul. 6, 2012. The entire contents of both documents are hereby incorporated herein by reference.

TECHNICAL FIELD

The present teachings relate generally to a method for allocating printed circuit boards on fitting lines for fitting the printed circuit boards with components. The present teachings also relate to a control device for a production or assembly line for fitting printed circuit boards or other subassemblies with components. The present teachings also relate to a computer program product and a computer-readable medium.

BACKGROUND

In the field of electronics production, printed circuit boards or subassemblies may be produced on SMT fitting lines by surface mounting (e.g., surface mounted technology, SMT). However, for technical reasons, not every printed circuit board may be produced on every fitting line. The printed circuit boards may have different production times on the fitting lines. In addition, the maximum production time capacities of the fitting lines may not be exceeded.

The document DE 10 2009 013 353 B3 describes a method for equipping a fitting line.

The document entitled "Workload planning in small lot printed circuit board assembly" (*OR Spectrum*, Jun. 1, 1997, Vol. 19, No. 2, pages 147-157) by Hans-Otto Günther et al. describes workload planning during automated fitting of printed circuit boards with components.

The document entitled "Cell formation in PCB assembly based on production quantitative data" (*European Journal of Operational Research*, Sep. 1, 1993, Vol. 69, No. 3, pages 312-329) by Dino Luzzatto et al. describes a method for planning an operation for fitting printed circuit boards with components.

The document EP 0 478 361 A1 describes a method for fitting printed circuit boards with components. A production frequency of a printed circuit board type and the components used for production are taken into account.

The document entitled "Component Grouping for Circuit Board Assembly" by Sze Man Ting (Jan. 1, 1999) describes the grouping of components during automated fitting of printed circuit boards with components.

Printed circuit boards on fitting lines of a fitting system may be allocated manually or semi-automatically based on empirical values or heuristics. In practice, unbalanced allocations are made repeatedly, thereby causing high utilization of one component of a fitting line and low utilization of another component. As a result, the fitting system may not be optimally used.

SUMMARY AND DESCRIPTION

The scope of the present invention is defined solely by the appended claims, and is not affected to any degree by the statements within this summary.

The present embodiments may obviate one or more of the drawbacks or limitations in the related art. For example, in some embodiments, an improved technique for allocating printed circuit boards on fitting lines is provided.

A fitting system includes a plurality of fitting lines configured for fitting printed circuit boards with electronic components. A method for allocating printed circuit boards to the fitting lines includes: detecting requirements for fitting a plurality of printed circuit boards with components to be respectively fitted thereon; and allocating the printed circuit boards to fitting lines under predetermined specifications by integer linear programming. The allocation may be carried out such that the similarity of component variances of the fitting lines is maximized. The component variance of a fitting line represents the number of different components that may be fitted on all printed circuit boards allocated to the fitting line. In other words, one of the parameters of the integer linear programming is selected such that the uniform distribution of the component variances of the fitting lines is optimized during allocation.

An equipment family may be determined as a set of printed circuit boards that may be fitted with components on a fitting line without changing the set of component types that are kept ready at the fitting line (e.g., equipment).

More printed circuit boards than may be included in an equipment family may be allocated to a fitting line since the number of component types kept ready at the fitting line may not be arbitrary. The fitting line may occasionally be subjected to an equipment change, wherein the equipment for a first equipment family is exchanged for the equipment for a second equipment family. The less frequent the equipment changes and the fewer the component types exchanged during an equipment change, the more cost-effectively the fitting system may be operated.

The uniform distribution of component variances reduces the need for conversion of a fitting line. Furthermore, the numbers of equipment families on the individual fitting lines may be more similar.

Variable elements of the fitting line (e.g., a shuttle table or a conveyor) may be converted less frequently. A shuttle table is a feed table that keeps a predetermined number of different electronic components ready for fitting. If a shuttle table is to be exchanged during conversion of a fitting line, the shuttle table is referred to as a variable table. Otherwise, the shuttle table is referred to as a constant table. Methods in accordance with the present teachings may result in an increased number of constant tables. Equipment families may be distributed more uniformly over the fitting lines. The situation wherein a large number of equipment families are formed for the fitting system (e.g., resulting in increased complexity and potentially more complex conversions of the fitting system) may be avoided. It has been found that a relationship between the component variance of a predetermined number of printed circuit boards and a number of equipment families is exponential rather than linear.

The integer linear programming may be carried out using a commercially available standard solver. Boundary conditions or optimization goals may be specified in the solver, such that similarity of the component variances of the fitting lines is maximized.

In some embodiments, the allocation may be carried out such that the component variance of each fitting line is below a predetermined threshold.

Excessive component variances on a fitting line may thus be prevented.

Alternatively or in addition, the allocation may be carried out such that the component variance of each fitting line is above a predetermined threshold, thereby preventing one of the fitting lines from having an excessively low component variance. An excessively low component variance may lead to a disproportionately greater component variance on at least one of the other fitting lines.

Furthermore, the allocation may be carried out such that the maximum component variance of all fitting lines is minimized, thereby improving the uniform distribution of the component variances over the fitting lines.

The allocation may also be carried out such that the maximum track consumption of all fitting lines is minimized to facilitate keeping the numbers of equipment families the same for the fitting lines. In some embodiments, the allocation is carried out such that the sum of component variances of all fitting lines is minimized. Further improved results may therefore be achieved (e.g., with optimization of the uniform distribution of component variances among fitting lines).

The allocation may also be carried out such that the sum of track consumptions of all components of a fitting line is below a predetermined threshold. A fitting machine of a fitting line may have a predetermined track width that specifies the number of tracks of the same width that may be used to convey components. A component may also use a plurality of tracks.

The allocation may also be carried out such that the sum of track consumptions of all components of a fitting line is above a predetermined threshold. By specifying a lower limit for the sum of track consumptions of a fitting line, a situation wherein a large number of tracks remain unused may be avoided.

In some embodiments, the allocation is carried out such that the sum of track consumptions of all components of a fitting line is minimized. Frequent changing of variable shuttle tables and the holding of a large number of shuttle tables may thus be avoided.

In some embodiments, the allocation is carried out such that a criterion including a plurality of weighted individual criteria is optimized. One criterion may relate to the uniform distribution of the component variances, and another criterion may relate, for example, to the sum of component variances of all fitting lines. As a result of the weighting, a parameter may be controlled as desired, for example, based on local or current priorities.

A computer program product includes program code for carrying out an above-described method when the computer program product runs on an execution device or is stored on a computer-readable medium. The computer program product may be created in a conventional programming language (e.g., C++, Java). The processing device may include a commercially available computer or server with corresponding input, output, and storage capabilities.

A control device configured for a fitting system having a plurality of fitting lines for fitting printed circuit boards with electronic components is configured to: detect a plurality of requirements, wherein each of the requirements defines a printed circuit board and respective components to be fitted thereon; and allocate the printed circuit boards to fitting lines under predetermined specifications by integer linear programming. The differences in component variances of the fitting lines are minimized. The component variance of a fitting line represents the number of different components that may be fitted on all printed circuit boards allocated to the fitting line.

BRIEF DESCRIPTION OF THE DRAWINGS

FIG. 1 shows an example of a fitting system.
FIG. 2 shows a flowchart of an exemplary method.

FIG. 3 shows a flowchart of an exemplary optimization method using integer linear programming.

DETAILED DESCRIPTION

Linear optimization is used in the field of mathematical optimization for the optimization of linear target functions over a set that is restricted by linear equations and inequalities. Linear optimization is the basis of the solution methods of (mixed) integer linear optimization.

Advantages of linear optimization include that linear optimization is a global optimization approach and is readily expandable. In addition, there are very good commercial standard solvers (e.g., SCIP, CPLEX, Ilog, Xpress) that are widely available and reliable. An additional advantage of linear optimization is that for a determined solution, the maximum distance of the determined solution from the optimal solution (e.g., gap) is known.

FIG. 1 shows a fitting system 100. The fitting system 100 includes a plurality of fitting lines 110 and a control device 115 configured for allocating printed circuit boards 120 to the fitting lines 110. Each fitting line 110 may include a transport system 125 and one or more fitting machines 130. Each fitting machine 130 includes one or more fitting heads 135. Each of the fitting heads 135 is configured to receive components from a constant table 140 or a variable table 145, and to position the components at a predetermined position on the printed circuit board 120 that is on the transport system 125.

During the fitting process, the printed circuit board 120 may be still with respect to the fitting machine 130. Each of the constant table 140 and the variable table 145 includes a multiplicity of feeding devices 150. Only one feeding device is shown in FIG. 1 for purposes of illustration. Each feeding device 150 keeps ready a supply of components 155 of a predetermined type. Although each feeding device 150 may be configured to keep different components 155 ready and different feeding devices 150 are fitted to a constant table 140 and a variable table 145, the constant table 140 and the variable table 145 may be completely exchanged for reasons of speed if a fitting machine 130 is to be supplied with components 155 that are not kept on one of the fitted constant table 140 and variable table 145. Since such a change may be associated with a production standstill, a goal is to minimize the number of constant tables 140 and variable tables 145 to be changed. If a table is not exchanged during a conversion process, the table is referred to as a constant table 140. Otherwise, the table is referred to as a variable table 145. Apart from this distinction, there are no functional differences between a constant table 140 and a variable table 145.

The printed circuit board 120 is to be fitted with a number of different components 155. To minimize frequent changing of variable tables 145, and to maximize the number of constant tables 140, the control device 115 is configured to optimize the allocation of a printed circuit board 120 to one of the fitting lines 110. The specific properties of each fitting line 110 and of each fitting machine 130 may be taken into account similar to the properties of the printed circuit boards 120 and the components 155 to be fitted on the printed circuit boards 120.

FIG. 2 shows a flowchart of an example of a method 200 for allocating printed circuit boards 120 to fitting lines 110 of the fitting system 100 shown in FIG. 1.

In a first act 205, requirements for allocating printed circuit boards 120 are detected. A requirement defines a printed circuit board 120 and the components 155 to be fitted thereupon. A number of boundary conditions (e.g., which printed circuit board 120 on which fitting line 110 may be fitted with components, or which component 155 may be processed by the fitting line 110) may also be specified. Further boundary conditions are described below.

Acts 210 to 230 define criteria or boundary conditions that influence subsequent allocation of a printed circuit board 120 to a fitting line 110. Each of the acts 210 to 230 shown in FIG. 2 is optional. One or more of acts 210 to 230 may be dispensed with entirely.

In act 210, a maximum component variance is stipulated for at least one of the fitting lines 110. An individual stipulation may be made with the result that different fitting lines 110 may potentially have different maximum component variances. The maximum component variance may be dependent on a property or a parameter of the respective fitting line 110.

In act 215, a minimum component variance may be stipulated for at least one of the fitting lines 110.

The minimum component variance may also be individually determined for each of the fitting lines 110 (e.g., based on a property or a parameter of the respective fitting line 110).

In act 220, a criterion to be optimized is determined for the subsequent allocation of printed circuit boards 120 to fitting lines 110. The allocation may be carried out such that the criterion is optimized (e.g., minimized or depending on context).

In some embodiments, the criterion includes a measure of the balance of the component variances between the individual fitting lines 110. A numerically large criterion may indicate a low balance, and a numerically small criterion may indicate a high balance of the component variances of the fitting lines 110. The criterion is minimized during the subsequent allocation. For example, the criterion may decrease to a standard deviation of the component variances of the fitting lines 110.

In some embodiments, the criterion relates to the component variance of all fitting lines 110, and is determined as the sum of component variances of all fitting lines 110. The criterion may be minimized for optimization.

In some embodiments, the criterion relates to the maximum of the component variances of all fitting lines 110, and the aim is to minimize the criterion.

In some embodiments, the criterion relates to the maximum of the track consumptions on all fitting lines 110, and the criterion may be minimized.

In some embodiments, the criterion is composed of weighted individual criteria (e.g., the balance of component variances of the fitting lines 110, the sum of component variances of all fitting lines 110, and the maximum of the component variances of all fitting lines 110). Weighting factors of the individual criteria for forming the criterion may be freely selectable. In some embodiments, one of the weighting factors may be further dependent on another parameter of the fitting system 100 (e.g., a degree of utilization).

The criterion may be composed of weighted individual criteria that relate to the sum of component variances of all fitting lines 110 and the balance of the component variances of the fitting lines 110.

In some embodiments, a further weighted individual criterion that relates to a balance of track consumptions on the fitting lines 110 may be used. For the purpose of receiving components 155, a constant table 140, a variable table 145, or a feeding device 150 may have a number of tracks that are each of the same width (e.g., 8 mm). Whereas a small component 155 (e.g., a resistor or a capacitor) may use only one track, a larger component (e.g., an integrated circuit, a shielding plate, or a housing element) may use a plurality of adjacent tracks. In this example, a track consumption of the small component 155 would be small (e.g., 1), and a track consumption of the large component would be greater (e.g., 4).

To maximize the degree of matching of the track consumptions of the fitting lines 110, the sum of track consumptions of all fitting lines 110 may be minimized. The track consumption of a fitting line 110 includes the sum of track consumptions of all components 155 that are to be fitted on one of the printed circuit boards 120 allocated to the respective fitting line 110.

In act 225, as a supporting measure for matching the track consumptions of the fitting lines 110, a maximum sum of track consumptions may be set for at least one of the fitting lines 110.

Similarly, in act 230, a minimum sum of track consumptions may be set for at least one of the fitting lines 110.

Printed circuit boards 120 are allocated to fitting lines 110 in act 235. The allocation in act 235 under the predetermined specifications may be carried out using integer linear programming.

An example of an embedding method 300 is outlined in the flowchart of FIG. 3.

In act 305, a starting allocation of printed circuit boards 120 on fitting lines 110 is determined, and a current allocation is equated to the starting allocation. Different heuristics that may also include manual specifications or restrictions may be used for determining the starting allocation.

In act 310, a subset of printed circuit boards 120 is selected from the printed circuit boards 120 to be allocated.

In act 315, one or more alternative allocations of printed circuit boards 120 in the subset to the fitting lines 110 are formed, (e.g., by integer linear programming). The allocations are carried out as described in reference to FIG. 2, such that balancing of the component variances of the individual fitting lines 110 is maximized. A weighted criterion of a plurality of individual criteria may be used for the allocation. Additional parameters may also be minimized or maximized to achieve optimized allocation.

In act 320, the qualities of the allocations formed in act 315 are determined or adopted from the linear optimization parameters from act 315. One or more quality parameters (e.g., a degree of utilization of a fitting machine 130 or the ratio of constant tables 140 to variable tables 145) may be predefined. In the method of FIG. 2, a criterion that includes a plurality of weighted individual criteria (one criterion maximizing the balance of the component variances of all fitting lines 110) may be used as the quality parameter.

In act 325, a check is carried out to determine whether a predetermined abort criterion has been reached. The abort criterion may include an allocation of a predetermined quality or the expiry of a predetermined computing time for the method 300.

In act 330, the determined allocations are output if the abort criterion has been satisfied.

In act 335, allocations that are to be further optimized may be selected from the determined allocations.

In act 340, the current allocation is set to one of the allocations to be optimized, and the method 300 may be repeated from act 310. If a plurality of allocations that may be optimized is selected, the method 300 may also be branched repeatedly in a parallel manner.

Mathematical Background

The use of exact mathematical methods provides considerably better solutions than conventionally used heuristics. In addition, good production times may also be achieved.

When allocating printed circuit boards 120 or subassemblies to a fitting line 110, not every printed circuit board 120 may be produced on every fitting line 110 due to technical reasons. The printed circuit boards may have different production times on the fitting lines 110. In addition, the maximum production time capacities of the fitting lines 110 may not be exceeded.

When allocating printed circuit boards 120 on fitting lines 110, the following goals may be pursued: maximize the number of printed circuit boards 120 produced using constant tables 140 to reduce the conversion effort; minimize the number of equipment families (e.g., "cluster") on the fitting lines 110 to reduce the amount of conversion time; minimize the amount of equipment (e.g., conveyor 150) used; minimize the total number of tables on the fixed equipment lines; maximize the number of constant tables on the fixed equipment lines; and minimize the total production time for the printed circuit boards 120.

In attempting to achieve one or more of the above-described goals, the best component coverage of the printed circuit boards 120 of a fitting line 110 may be sought, or the sum of component variances of the fitting lines 110 may be minimized.

Integer programming (IP) models (e.g., integer program or integer optimization models) may be used to determine an optimized allocation of printed circuit boards 120 to the fitting lines 110. The determination may be carried out using a conventional standard solver.

Indices

L: Set of SMT fitting lines 110 of the system 100
R: Set of printed circuit boards 120
C: Set of component types 155
$R_c$: Set of printed circuit boards with component type c
$R_l$: Set of printed circuit boards that may be fitted with components on line 1

Parameters $Time_{r,l}$: Total production time for printed circuit board r on line 1
$TimeLimit_l$: Production time limit on line 1

Binary Variables $Assign_{r,l}$: Allocation of printed circuit board r to line 1
$Setup_{c,l}$: Use of a component c on a line 1

IP Formulation $$\text{minimize} \sum_{c \in C} \sum_{l \in L} Setup_{c,l}$$

s.t.:

$$\sum_{l \in L} Assign_{r,l} = 1 \qquad r \in R$$

$$Assign_{r,l} = 0 \qquad l \in L, r \in R/R_l$$

$$\sum_{r \in R_c} Assign_{r,l} \leq Setup_{c,l} |R_c| \qquad c \in C, l \in L$$

$$\sum_{r \in R} Assign_{r,l} Time_{r,l} \leq TimeLimit_l \qquad l \in L$$

$$Setup_{c,l} \in \{0, 1\} \qquad c \in C, l \in L$$

$$Assign_{r,l} \in \{0, 1\} \qquad r \in R, l \in L$$

To improve the allocation of complex printed circuit boards 120 over the fitting lines 110, the solver may be provided with conditions. The conditions set may be aimed at optimizing the allocation of printed circuit boards 120 on the fitting lines 110, such that the uniformity of distribution of the component variances of the fitting lines 110 over the fitting lines 110 is maximized.

A first condition may involve providing an upper restriction for the component variance for each fitting line 1 by a predetermined limit.

$$\forall l \in L: \sum_{c \in C} Setup_{c,l} \leq MaxSetup_l$$

$MaxSetup_l$: first predetermined number

Furthermore, a lower restriction to a minimum number $MinCountBig_1$ may be provided for the component variance for each fitting line 1.

$$\forall l \in L: \sum_{c \in C} Setup_{c,l} \geq MinSetup_l$$

$MinSetup_l$: second predetermined number

The maximum component variance of all fitting lines may be defined as an additional weighted target function component that may be optimized.

$$\min \max_{l \in L} \sum_{c \in C} Setup_{c,l}$$

An upper restriction to $MaxCapacity_1$ may be provided for the sum of track consumptions of all components of a fitting line 1.

$$\forall l \in L: \sum_{c \in C} Setup_{c,l} Width_c \leq MaxCapacity_l$$

$MaxCapacity_1$: third predetermined number

A lower restriction to $MinCapUtilisation_1$ may be provided for the sum of track consumptions of all components 155 of a fitting line 1. The $Width_c$ denotes the track consumption of a component 155.

$$\forall l \in L: \sum_{c \in C} Setup_{c,l} Width_c \geq Min CapUtilisation_l$$

$MinCapUtilisation_1$: fourth predetermined number

The sum of track consumptions of all components 155 of a fitting line 1 across all fitting lines 110 may be specified as an additional weighted target function component.

$$\min \max_{l \in L} \sum_{c \in C} Setup_{c,l} Width_c$$

By using at least one of the above-described specifications, the printed circuit boards 120 may be distributed across the fitting lines 110 in an improved manner. As a result, conversions of fitting lines 110 may be reduced. In addition, production times of printed circuit boards 120 in the fitting system 100 may be improved. Furthermore, the allocations may be determined more quickly than by using a conventional approach described by an IP solver.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A method for fitting printed circuit boards with components using fitting lines of a fitting system, the method comprising:
    detecting a plurality of requirements, wherein each of the plurality of requirements defines a printed circuit board and respective components to be fitted thereon;
    allocating the printed circuit board to fitting lines under predetermined specifications using integer linear programming; and
    fitting the printed circuit board with components on respectively allocated fitting lines,
    wherein differences in component variances of the fitting lines are minimized,
    wherein a component variance of a fitting line represents a number of different components configured to be fitted on all printed circuit boards allocated to the fitting line,
    wherein a maximum track consumption of all of the fitting lines is minimized, and
    wherein track consumption of a fitting line represents the number of adjacent tracks of the fitting line used by a component while being conveyed on the fitting line to the allocated printed circuit board.

2. The method of claim 1, wherein the component variance of each fitting line is below a predetermined threshold.

3. The method of claim 2, further comprising minimizing a maximum component variance of all of the fitting lines.

4. The method of claim 2, further comprising minimizing a sum of component variances of all of the fitting lines.

5. The method of claim 2, wherein a sum of track consumptions of all components of a fitting line is below a predetermined threshold.

6. The method of claim 2, wherein a sum of track consumptions of all components of a fitting line is above a predetermined threshold.

7. The method of claim 1, wherein the component variance of each fitting line is above a predetermined threshold.

8. The method of claim 7, further comprising minimizing a maximum component variance of all of the fitting lines.

9. The method of claim 7, further comprising minimizing a sum of component variances of all of the fitting lines.

10. The method of claim 7, wherein a sum of track consumptions of all components of a fitting line is below a predetermined threshold.

11. The method of claim 7, wherein a sum of track consumptions of all components of a fitting line is above a predetermined threshold.

12. The method of claim 1, further comprising minimizing a maximum component variance of all of the fitting lines.

13. The method of claim 12, further comprising minimizing a sum of component variances of all of the fitting lines.

14. The method of claim 1, further comprising minimizing a sum of component variances of all of the fitting lines.

15. The method of claim 1, wherein a sum of track consumptions of all components of a fitting line is below a predetermined threshold.

16. The method of claim 1, wherein a sum of track consumptions of all components of a fitting line is above a predetermined threshold.

17. The method of claim 1, further comprising minimizing a sum of track consumptions of all components of a fitting line.

18. The method of claim 1, further comprising optimizing a criterion that comprises a plurality of weighted individual criteria.

19. A non-transitory computer-readable storage medium stored therein data representing instructions executable by a programmed processor for fitting printed circuit boards with components using fitting lines of a fitting system, the storage medium comprising instructions for:
    detecting a plurality of requirements, wherein each of the plurality of requirements defines a printed circuit board and respective components to be fitted thereon;
    allocating the printed circuit board to fitting lines under predetermined specifications using integer linear programming; and
    fitting the printed circuit board with components on respectively allocated fitting lines,
    wherein differences in component variances of the fitting lines are minimized,
    wherein a component variance of a fitting line represents a number of different components configured to be fitted on all printed circuit boards allocated to the fitting line,
    wherein a maximum track consumption of all of the fitting lines is minimized, and
    wherein track consumption of a fitting line represents the number of adjacent tracks of the fitting line used by a component while being conveyed on the fitting line to the allocated printed circuit board.

20. A control device configured for fitting printed circuit boards with components using fitting lines of a fitting system, the control device being configured:
    to detect a plurality of requirements, wherein each of the plurality of requirements defines a printed circuit board and respective components to be fitted thereon;
    to allocate the printed circuit board to fitting lines under predetermined specifications using integer linear programming, such that differences in component variances of the fitting lines are minimized, wherein a component variance of a fitting line represents a number of different components configured to be fitted on all printed circuit boards allocated to the fitting line, and such that a maximum track consumption of all of the fitting lines is minimized, wherein track consumption of a fitting line represents the number of adjacent tracks of the fitting line used by a component while being conveyed on the fitting line to the allocated printed circuit board; and to control the fitting of the printed circuit boards with components on respectively allocated fitting lines.

* * * * *